United States Patent [19]

Zelez

[11] 4,357,203

[45] Nov. 2, 1982

[54] PLASMA ETCHING OF POLYIMIDE

[75] Inventor: Joseph Zelez, Tannersville, Pa.

[73] Assignee: RCA Corporation, New York, N.Y.

[21] Appl. No.: 335,852

[22] Filed: Dec. 30, 1981

[51] Int. Cl.$^3$ .................... B44C 1/22; C03C 15/00; C03C 25/06

[52] U.S. Cl. .................................. 156/643; 156/644; 156/646; 156/651; 156/659.1; 156/668; 134/1; 204/192 E; 252/79.1

[58] Field of Search ............... 156/643, 644, 646, 655, 156/650, 651, 652, 653, 656, 657, 659.1, 668; 252/79.1; 204/192 E, 192 EC, 298; 427/38, 39, 41; 134/1

[56] References Cited

U.S. PATENT DOCUMENTS 4,278,493  7/1981  Petvai ................................ 156/643

OTHER PUBLICATIONS

Rhodes, *Semiconductor International*, Mar. 1981, pp. 65-68 & 70.

Miller, *Circuits Manufacturing*, Apr., 1977.

Vossen et al., *J. of Vac. Sci. Tech.*, vol. 11, No. 1, Jan.-/Feb. 1974, pp. 60-70.

O'Neill, *Semiconductor International*, Apr., 1981, pp. 67, 68, 72, 74, 76, 78, 80, 82, 84, 86 and 88.

Herndon et al. paper entitled, "Inter-Metal Polyimide Insulation for VLSI", Kodak Microelectronics Seminar, Oct. 1979.

Mukai et al., *IEEE Journal of Solid-State Circuits*, vol. SC-13, No. 4, pp. 462-467, Aug. 1980.

Lee et al., *Organic Coatings and Plastic Chemistry*, vol. 43, pp. 451-457, 1981.

*Primary Examiner*—William A. Powell
*Attorney, Agent, or Firm*—Birgit E. Morris; R. Hain Swope

[57] ABSTRACT

An improvement in the formation of multilayer metallization systems wherein vias are formed in a dielectric insulating layer of polyimide which overlies a layer of metal such as aluminum. In accordance with the invention, the residual film remaining after oxygen plasma etching of the polyimide is efficiently removed by a second plasma etching utilizing a mixture of argon and hydrogen.

7 Claims, No Drawings

PLASMA ETCHING OF POLYIMIDE

This invention relates to sputter etching of polyimide insulation in the preparation of multilayer metallization systems.

BACKGROUND OF THE INVENTION

The increasing demands for very large-scale integrated circuits (VLSI) have made imperative the development of practical, reliable, multilevel metallization systems. In such systems, two layers of metal, generally aluminum or an aluminum alloy, are separated by a layer of insulating dielectric material which contains vias in a predetermined pattern. Because there is contact between two metal layers in the vias it is critical that they be cut cleanly to assure maximum contact with minimal resistance.

While a number of materials have been and are used for forming the insulating dielectric layer in such multilayer metallization systems, the current trend in the electronics industry is toward the use of polyimides. Vias are commonly formed in polyimide dielectric layers by oxygen plasma etching. Although effective, oxygen plasma etching is disadvantageous in that there is formed at the bottom of such vias a residual film of insulating material which interferes with metal-to-metal contact. A significantly efficient method of removing this film is provided in accordance with this invention.

SUMMARY OF THE INVENTION

In accordance with this invention, there is provided a method of removing a residual film formed during oxygen plasma etching of polyimide by plasma etching utilizing a mixture of hydrogen and argon.

DETAILED DESCRIPTION OF THE INVENTION

The residual film formed during oxygen plasma etching of polyimide insulation layers in multilayer metallization systems has been described in the literature. For example, Herndon et al in a paper entitled, "Inter-Metal Polyimide Insulation for VLSI" at the Kodak Microelectronics Seminar in Rochester, N.Y., October, 1979, characterized it as "an invisible film of residual insulation." Herndon et al were unable to view the film microscopically. While the presence of carbon, nitrogen and oxygen in the film has been established, its exact chemical makeup remains unknown.

Herndon et al found the residual film to be very tenacious and to be an effective insulator against the desired metal-to-metal contact in multilayer metallization systems. The presence of this film can be established by Auger Electron Spectroscopy.

It is not known whether the subject film is formed during oxygen plasma etching of all polyimides, but its presence has been shown with all polyimides etched in this manner to date. It is further not known whether the composition of the film varies with the structure of the polyimide being oxygen plasma etched. Available data has demonstrated, however, that the tenaciousness, resistance to chemical and plasma etching and resistance to good metal-to-metal contact are substantially uniform for these films independent of the polyimide being etched.

A number of etching techniques, such as extended oxygen plasma etch at increased voltage and the use of other conventional plasma etchants have been reported in the literature as being ineffective in removing the subject polyimide residue film. Herndon et al report its removal with sputter using pure argon. It has been found, however, that pure argon sputter etching is not an efficient means of removing this film.

In accordance with this invention, the subject residual films are removed by plasma etching utilizing a plasma comprising a mixture of argon and hydrogen. The subject mixtures preferably have a ratio of partial pressures from 2:4 to 7:2 argon to hydrogen, with partial pressures in the ratio 6:2 being particularly preferred. Removal of the film utilizing these mixtures of argon and hydrogen is, unexpectedly, significantly more effective than with pure argon. The subject method is further advantageous in that it does not degrade the integrity of the vias or damage the underlying substrate as is the case with other methods such as successive dips in nitric acid and hydrazine or a plasma etch using carbon tetrafluoride at higher voltage, i.e. 1400 volts and above.

In accordance with this invention, plasma etching of the subject film is carried out at a voltage range of from about 800 to about 1,200 volts with about 1,000 volts being preferred. Etching is carried out for from about 1 to about 30 minutes with about 10 minutes being preferred. These ranges are preferred for a conventional non-modulated power supply, i.e. a continuous wave oscillator. Utilizing a less efficient modulated power supply, i.e. a self-excited oscillator, would require higher voltage and/or longer etch time to accomplish the same results. Such adjustments are considered to be within the skill of the art.

The substrate upon which a layer of insulating polyimide is formed as part of the preparation of a multilayer metallization system may be any suitable inert material such as polysilicon with coating of a metal, usually aluminum or an alloy thereof. The aluminum coating may in turn have a thin coating of a substance such as titanium, a borosilicate glass or a phosphosilicate glass to enhance adhesion of the polyimide thereto. The polyimide can be any of those materials known to be useful in electronic packaging, processing etc. due to their excellent chemical resistance and good mechanical/electrical properties. A number of such resins are available commercially, for example, PIQ available from Hitachi Chemical Co. and PI2555 available from E. I. duPont de Nemours & Co.

In general, the polyimide layer is applied to the metal coated substrate and cured to form a smooth layer. The polyimide layer is then masked and oxygen plasma etched under conventional conditions. The residual insulating film is removed from the vias by the method of this invention. A top layer of aluminum is then applied so that there is good metal-to-metal contact in the vias. This procedure may be repeated for additional metal layers if desired.

The following Examples further illustrate this invention, it being understood that the invention is in no way intended to be limited to the details described therein. In the Examples, all parts and percentages are on a weight basis and all temperatures are in degrees Celsius, unless otherwise stated.

EXAMPLE 1

Silicon wafers having a 1.2 micrometers thick coating of aluminum thereon and a 2.7 micrometers thick coating of polyimide (PI2555 available from E. I. duPont de Nemours & Co.) thereon were coated with a layer of aluminum 2.0 micrometers thick which was patterned and developed to form a mask. The pattern provided for vias 20×20, 15×15, 10×10 and 5×5 microns, respectively.

The wafers were placed on a water cooled aluminum backing plate in a conventional plasma chamber. The chamber was evacuated to its ultimate pressure, approximately $1 \times 10^{-6}$ torr., and then backfilled with ultrapure oxygen to a pressure of $8 \times 10^{-4}$ torr. The pressure was adjusted to obtain a pressure of 10 millitorr and a non-modulated negative DC potential of 1.1 KV was applied to the backing plate. Etching was carried out for 8 minutes.

Eight wafers as a control were subjected to plasma etching using a pure argon atmosphere under the same conditions of pressure and voltage. Etching was carried out for 30, 40, 50 and 60 minutes, respectively, on groups of two samples. Analysis of the bottom of the vias with an Auger Electron Spectrometer showed the presence of carbon, nitrogen and oxygen in each instance which is indicative of the fact that the film remaining after oxygen plasma etching was not effectively removed by pure argon plasma etching.

Twelve samples of the wafers were plasma etched with a mixture of ultrapure argon and hydrogen in a partial pressure ratio of 6:2 utilizing the same conditions of pressure and voltage. Plasma etching was carried out for twenty minutes. Auger Electron Spectrometer analysis showed that the film had been efficiently removed.

Other samples were plasma etched under the following conditions with comparable results.

| Sample | Voltage | Time | Partial Pressure Ratio, Argon to Hydrogen |
|---|---|---|---|
| 1 | −1.1K | 20 Min. | 4:3 |
| 2 | −1.1K | 20 Min. | 2:4 |
| 3 | −1.1K | 15 Min. | 6:2 |
| 4 | −1.1K | 10 Min. | 4:3 |
| 5 | −1.1K | 25 Min. | 6:2 |

EXAMPLE 2

Silicon substrates were coated with aluminum, polyimide and aluminum as in Example 1. The top aluminum layer was patterned and developed, the pattern provided 90 vias of various sizes including 5×5, 10×10, 15×15 and 20×20 micrometers. Groups of four substrates were treated in accordance with Example 1, i.e. a pure argon etch and an argon/hydrogen etch, respectively.

The substrates were then coated with a third layer of aluminum so that there was contact between the third and first layers of aluminum in the vias. A 1.0 milliamp test current was applied to each substrate and the resistance of each determined with an ohmmeter. A resistance of 4 ohms or less per substrate was indicative of good contact in each via. The substrates sputter etched in pure argon demonstrated resistance between 10 and 95 ohms. All substrates sputter etched in argon/hydrogen had a resistance of 4 ohms or less.

In a subsequent experiment under production conditions, four substrates similarly prepared were sputter etched utilizing argon/hydrogen. A resistance of 4 ohms or less was achieved in all substrates.

I claim:

1. In a method of forming a multilayer metallization system including the step of forming vias in a polyimide dielectric insulating layer overlying a layer of metal by oxygen plasma etching, the improvement comprising plasma etching with a mixture of argon and hydrogen after oxygen plasma etching.

2. A method in accordance with claim 1, wherein the partial pressures of argon and hydrogen in said mixture are in a ratio from about 2:4 to about 7:2.

3. A method in accordance with claim 2, wherein the partial pressures of argon and hydrogen in said mixture are in a ratio of about 6:2.

4. A method in accordance with claim 1, wherein said metal layer is aluminum.

5. A method in accordance with claim 1, wherein said plasma etching with argon and hydrogen is carried out at a negative potential of from about 800 to about 1,200 volts for from 1 to about 30 minutes.

6. A method in accordance with claim 1, wherein the polyimide layer is subsequently coated with a second layer of metal to provide contact between the first and second layers of metal in the vias.

7. A method in accordance with claim 6, wherein the first and second layers of metal are aluminum.

* * * * *